(12) United States Patent
Yuzawa

(10) Patent No.: US 7,598,612 B2
(45) Date of Patent: Oct. 6, 2009

(54) SEMICONDUCTOR DEVICE AND MANUFACTURING METHOD THEREOF

(75) Inventor: Takeshi Yuzawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 291 days.

(21) Appl. No.: 11/262,728

(22) Filed: Nov. 1, 2005

(65) Prior Publication Data

US 2006/0125095 A1    Jun. 15, 2006

(30) Foreign Application Priority Data

Dec. 9, 2004    (JP) .............................. 2004-356818

(51) Int. Cl.
    *H01L 23/48*    (2006.01)
(52) U.S. Cl. ................ 257/737; 257/781; 257/E23.021
(58) Field of Classification Search ................ 257/734, 257/737, 738, 758, 751, E23.021, E23.069, 257/E21.508, 773, 779–781, 786
    See application file for complete search history.

(56) References Cited

U.S. PATENT DOCUMENTS

| | | | | |
|---|---|---|---|---|
| 6,400,021 B1* | 6/2002 | Cho | ............................ | 257/738 |
| 6,538,326 B2 | 3/2003 | Shimizu et al. | | |
| 6,897,570 B2* | 5/2005 | Nakajima et al. | ............ | 257/786 |
| 7,223,683 B2* | 5/2007 | Lin | ............................ | 438/613 |
| 2007/0273031 A1* | 11/2007 | Lee et al. | ..................... | 257/759 |

FOREIGN PATENT DOCUMENTS

| JP | A 2001-144216 | 5/2001 |
|---|---|---|
| JP | A 2001-176966 | 6/2001 |
| JP | A 2002-198374 | 7/2002 |
| JP | A 2002-246407 | 8/2002 |
| JP | A 2002-319587 | 10/2002 |
| JP | A 2005-347622 | 12/2005 |
| JP | A 2005-347623 | 12/2005 |

* cited by examiner

*Primary Examiner*—Davienne Monbleau
*Assistant Examiner*—Hoa B Trinh
(74) *Attorney, Agent, or Firm*—Oliff & Berridge, PLC

(57) ABSTRACT

A semiconductor device including a semiconductor substrate containing a plurality of electrode pads and a passivation film with an opening that exposes a central area of each of the electrode pads, and a bump electrically connected to each of the electrode pads, the bump being disposed to overlap the opening and an end of the opening, wherein at least part of an area contacting the bump on a surface of the passivation film is an uneven surface.

6 Claims, 4 Drawing Sheets

(A)

(B)

SEMICONDUCTOR DEVICE AND MANUFACTURING METHOD THEREOF

The entire disclosure of Japanese Patent Application No. 2004-356818, filed Dec. 9, 2005 is expressly incorporated by reference herein.

BACKGROUND OF THE INVENTION

1. Technical Field

The present invention relates to a semiconductor device and its manufacturing method.

2. Related Art

A semiconductor device with a bump disposed to overlap an-opening of a passivation film and its end is known. JP A-2002-246407 is an example of related art. If moisture such as an etchant entering between the passivation film and the bump can be prevented from reaching the inside of the opening of the passivation film, reliability of the semiconductor device can be enhanced.

SUMMARY

An advantage of some aspects of the present invention is to provide a semiconductor device with high reliability and its manufacturing method.

(1) A semiconductor device according to an aspect of the invention comprises a semiconductor substrate containing a plurality of electrode pads and a passivation film with an opening that exposes a central area of one of the electrode pads; and a bump electrically connected to one of the electrode pads, the bump being disposed to overlap the opening and its end; wherein at least part of an area contacting the bump on the surface of the passivation film is an uneven surface. Thus, the distance from the end of the bump to the opening of the passivation film along the surface of the passivation film can be made longer. Moisture entering from the end of the bump can therefore be prevented from reaching the electrode pad. As a result, a semiconductor device with high reliability can be provided.

(2) In this semiconductor device, the entire area contacting the bump on the surface of the passivation film may be an uneven surface.

(3) In this semiconductor device, at least part of the surface of the electrode pad may be an uneven surface, and the unevenness on the surface of the passivation film may correspond to the unevenness on the surface of the electrode pad.

(4) In this semiconductor device, an area between two recesses adjacent to each other on the surface of the electrode pad may be an even surface.

(5) In this semiconductor device, at least part of an area exposed from the opening on the surface of the electrode pad may be an uneven surface.

(6) In this semiconductor device, the semiconductor substrate may further contain a conductive pattern and an insulating layer in which a plurality of through-holes partially exposing the conductive pattern are formed; the electrode pad may be provided to fill the through-holes; and each recess of the electrode pad may overlap any one of the through-holes.

(7) In this semiconductor device, an end of the through-hole at the side opposite to the conductive pattern may have a taper shape that widens towards the outside, and the periphery of the through-hole on an upper end surface of the insulating layer may be an even surface.

(8) A method of manufacturing a semiconductor device according to an aspect of the invention comprises forming a barrier layer on a semiconductor substrate containing a plurality of electrode pads and a passivation film with an opening that exposes a central area of one of the electrode pads; forming on the barrier layer a conductive material that overlaps the opening of the passivation film and its end; and partially removing the barrier layer by etching it with the conductive material as a mask, wherein at least part of the end of the opening on the surface of the passivation film is an uneven surface. Thus, the distance from the end of the bump to the opening of the passivation film along the surface of the passivation film is made longer. An etchant or the like entering from the end of the bump can therefore be prevented from reaching the electrode pad. As a result, a semiconductor device with high reliability can be manufactured.

(9) In this method of manufacturing a semiconductor device, the entire end of the opening on the surface of the passivation film may be an uneven surface.

BRIEF DESCRIPTION OF THE DRAWINGS

The invention will be described with reference to the accompanying drawings, wherein like numbers refer to like elements.

DESCRIPTION OF THE EMBODIMENT

An embodiment of the invention will now be described with reference to the drawings. However, the invention is not intended to be limited to this embodiment.

Figure 1:
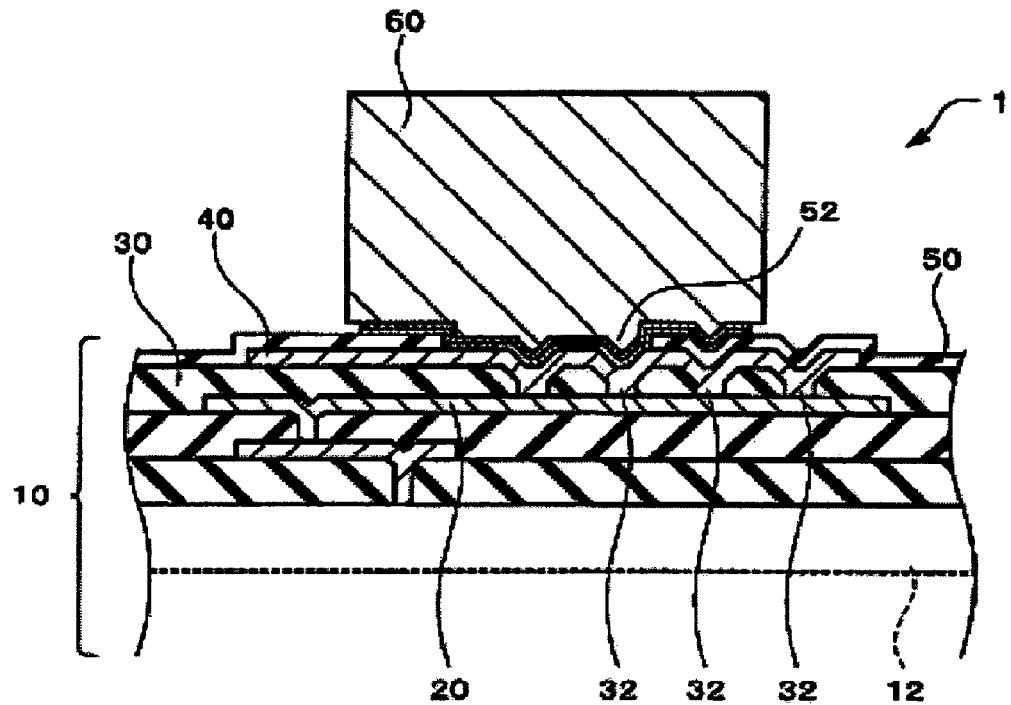
FIG. 1 is a view for illustrating a semiconductor device according to an embodiment of the invention.

FIG. 1 is a view for illustrating a semiconductor device according to the embodiment of the invention.

The semiconductor device according to the present embodiment includes a semiconductor substrate 10. The structure of the semiconductor substrate 10 will be described below. The semiconductor substrate 10 may be, for example, a silicon substrate. The semiconductor substrate 10 may take the form of a chip (see FIG. 4), or may take the form of a wafer (not shown). Within the semiconductor substrate 10, one or plural integrated circuits 12 may be formed (if the semiconductor substrate has the form of a chip, one integrated circuit is formed, whereas if the semiconductor substrate has the form of a wafer, plural integrated circuits are formed). There is no particular restriction on elements of the integrated circuit 12; they may include, for example, active elements such as transistors, and passive elements such as resistors, coils, and condensers.

The semiconductor substrate 10 may contain a conductive pattern 20. The conductive pattern 20 may be electrically connected to the integrated circuit 12. There is no particular restriction as to the material and structure of the conductive pattern 20; a conductor using any one of known materials and having any one of known structures may be utilized.

The semiconductor substrate 10 may contain an insulating layer 30. The insulating layer 30 may be formed of an oxide film (e.g., silicon oxide film). The insulating layer 30 may be formed to cover at least part of the conductive pattern 20. The insulating layer 30 may include multiple layers, or may be formed in a single layer. If the insulating layer 30 includes multiple layers, conductive patterns may be formed between the multiple layers.

The insulating layer 30 has a plurality of through-holes 32 formed therein, which partially expose the conductive pattern 20. The through-holes 32 are holes used to electrically connect the conductive pattern 20 with an electrode pad 40 (described later). If the insulating layer 30 includes multiple layers, only a through-hole formed in the uppermost layer of the insulating layer 30 may be referred to as the through-hole 32. An end of the through-hole 32 at the side opposite to the conductive pattern 20 may have a taper shape that widens towards the outside as shown in FIG. 1 (or FIGS. 2C and 3B). In this case, the periphery of the through-hole 32 on the surface of the insulating layer 30 may be an even surface. Thus, a semiconductor device with high reliability that enables the prevention of a crack having its starting point at the periphery of the through-hole 32 (or an area overlapping the periphery of the through-hole 32) in the electrode pad 40 or a passivation film 50, which will be described later, can be provided. In general, a large force is sometimes exerted on a bump 60 when a semiconductor device is mounted on a circuit board, an interposer, or the like. Particularly, an area overlapping the bump 60 is more affected by the force. If the periphery of the through-hole 32 is an even surface, the reliability of the semiconductor device can be ensured even with the bump 60 placed to overlap the through-hole 32. This allows greater placement freedom of the bump 60, enabling the design of a semiconductor device with excellent mounting capability.

Figure 2:
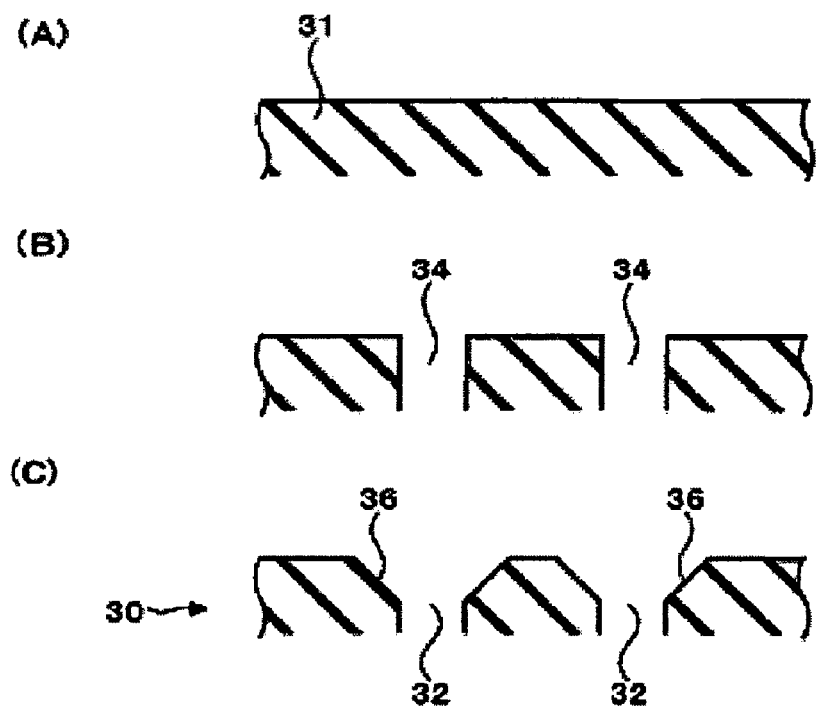
FIGS. 2A to 2C are views for illustrating a semiconductor device according to an embodiment of the invention.
Figure 3:
FIGS. 3A and 3B are views for illustrating a semiconductor device according to an embodiment of the invention
Figure 3:
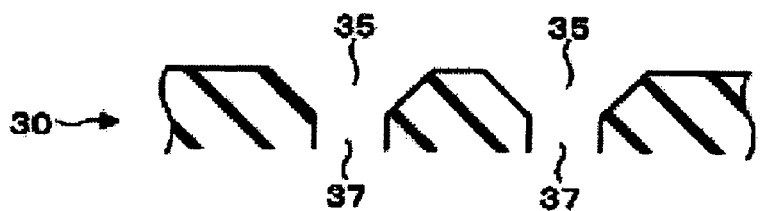

There is no particular restriction as to a method of forming the through-holes 32. Description of the method of forming the through-holes 32 will be given below with reference to FIGS. 2A to 2C. Initially, an insulating layer 31 is formed as shown in FIG. 2A. The insulating layer 31 may be formed by a spin coating method, a chemical vapor deposition (CVD) method, or the like. Then, through-holes 34 are formed in the insulating layer 31 as shown in FIG. 2B. The through-holes 34 may be formed by photolithography, etching, or the like. The through-holes 34 may be the holes that expose the conductive pattern 20 or an element of the integrated circuit 12. The through-holes 34 may be formed to have their wall surfaces that extend downward vertically from the top surface of the insulating layer 31 as shown in FIG. 2B. Taper surfaces 36 that widen towards the opening direction may be formed at the opening ends of the through-holes 34 as shown in FIG. 2C. The taper surfaces 36 may be even surfaces or curved surfaces. The taper surfaces 36 may be formed by etching. The taper surfaces 36 may be the surfaces that continuously follow all circumferences of the through-holes 34. By the processes described above, the through-holes 32 (the insulating layer 30 including the through-hole 32) may be formed. Additionally, the taper surfaces 36 may be formed so that two adjacent taper surfaces 36 do not overlap each other as shown in FIG. 2C. This allows the periphery of the taper surface 36 at the upper end surface of the insulating layer 30 to have an obtuse angle compared with the case where the taper surfaces 36 of the adjacent through-holes 32 overlap each other. Thus, the insulating layer 30 can be formed so that the periphery of the through-hole 32 is an even surface. The method of forming the through-holes 32, however, is not limited to this. For example, a method of forming taper holes 35 of the insulating layer 31 as shown in FIG. 3A, and then forming through-holes 37 on the bottoms of the taper holes 35 as shown in FIG. 3B is also possible. At this point, the taper holes 35 may be formed by wet etching, and the through-holes 37 may be formed by dry etching. The taper holes 35 may be formed so that the opening ends of two adjacent taper holes 35 do not overlap each other. By the processes described above, the through-holes 32 (the insulating layer 30 including the through-holes 32) may be formed.

The semiconductor substrate 10 contains a plurality of electrode pads 40 (however, only one electrode pad 40 is shown in FIG. 1). The electrode pad 40 may be electrically connected to the conductive pattern 20. The electrode pad 40 may be formed so as to fill the through-holes 32 as shown in FIG. 1, whereby the electrode pad 40 may be electrically connected to the conductive pattern 20. At least part of the surface of the electrode pad 40 may be an uneven surface as shown in FIG. 1. In this case, at least part of an area exposed from an opening 52 (described later) of the passivation film 50 on the surface of the electrode pad 40 may be an uneven surface. Thus, because the area of a contact surface between the electrode pad 40 and the bump 60 (described later) becomes large, a semiconductor device with high electrical reliability can be provided. An area between two recesses adjacent to each other on the surface of the electrode pad 40 may be an even surface. Particularly in the area overlapping the passivation film 50, the area between two recesses adjacent to each other on the surface of the electrode pad 40 may be an even surface. This can prevent a crack having its starting point at the upper end surface of the electrode pad 40 from occurring in the passivation film 50. The reliability of a semiconductor device can thereby be enhanced. The area where the electrode pad 40 is placed is not particularly limited. For example, the electrode pad 40 may be placed to overlap any element of the integrated circuit 12. However, the electrode pad 40 may be placed in the area that does not overlap the integrated circuit 12. The recess of the electrode pad 40 may overlap the through-hole 32 of the insulating layer 30. In other words, the surface of the electrode pad 40 may be made uneven by utilizing the through-holes 32 of the insulating layer 30. In this case, if the periphery of the through-hole 32 at the upper end surface of the insulating layer 30 is an even surface, the electrode pad 40 can be formed so that its area between two recesses adjacent each other is an even surface. The method of forming the electrode pad 40 is not particularly limited. The electrode pad 40 may be formed, for example, by sputtering. If the end of the through-hole 32 has a taper shape that widens towards the outside, a conductive material can readily be deposited onto the internal wall surface of the through-hole 32 by a sputtering process. Namely, the inside of the through-hole 32 can readily be filled with a conductive material. Therefore, the electrode pad 40 with high reliability can be formed effectively.

The semiconductor substrate 10 contains the passivation film 50. The passivation film 50 has an opening 52 formed therein. The opening 52 is disposed to overlap the central area of each electrode pad 40. In other words, the central area of the electrode pad 40 is exposed from the passivation film 50 by the opening 52. At least part of the surface of the passivation film 50 is an uneven surface. In this case, at least part of an area contacting the bump 60 (described later) on the surface of the passivation film 50 is an uneven surface. The entire area contacting the bump 60 on the surface of the passivation film 50 may be an uneven surface (not shown). If the surface of the electrode pad 40 is an uneven surface, the unevenness of the surface of the passivation film 50 may correspond to the unevenness of the surface of the electrode pad 40. However, the surface of the electrode pad 40 may be an even surface. In this case, only the surface of the passivation film 50 may be an uneven surface (not shown). Additionally, the material of the passivation film 50 is not particularly limited; the passivation film may be formed of for example, an oxide film, a nitride film, a polyimide resin, or the like.

The semiconductor device according to the embodiment includes the bump 60. The bump 60 is electrically connected to each of the electrode pads 40. The bump 60 is disposed to overlap the opening 52 of the passivation film 50 and its end as shown in FIG. 1. Since at least part of the end of the opening 52 of the passivation film 50 is an uneven surface, the bump 60 is disposed to overlap the uneven surface of the passivation film 50. There is no particular restriction on a material and a structure of the bump 60; any one of known bumps may be used. For example, the bump 60 may be a gold bump.

Figure 4:
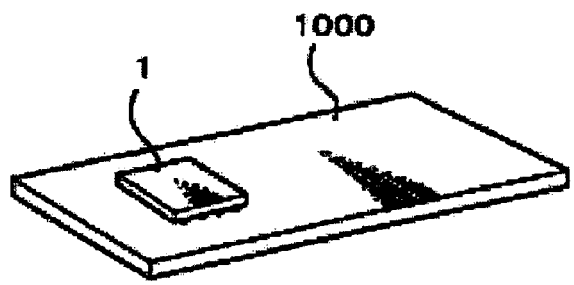
FIG. 4 is a view that shows a circuit board on which a semiconductor device according to an embodiment of the invention is mounted.
Figure 5:
FIG. 5 is a view that shows an electronic device having a semiconductor device according to an embodiment of the invention.
Figure 6:
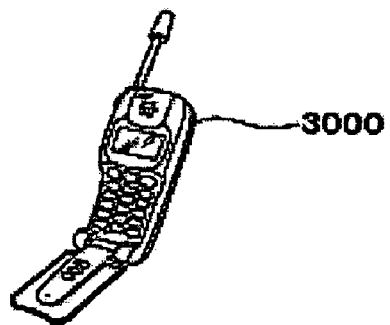
FIG. 6 is a view that shows an electronic device having a semiconductor device according to an embodiment of the invention.

A semiconductor device 1 according to the embodiment is structured as described above. As in the above description, in the semiconductor device 1, at least part of an area that contacts the bump 60 on the surface of the passivation film 50 is an uneven surface. Consequently, the distance from the end of the bump 60 to the opening 52 of the passivation film 50 along the surface of the passivation film 50 is made longer. This long distance can prevent moisture or the like entering between the passivation film 50 and the bump 60 from reaching the opening 52 of the passivation film 50. A semiconductor device with high reliability that can prevent the degradation of the electrode pad 40 because of the entering of moisture or the like can be provided. Additionally, the entire surface of the area contacting the bump 60 on the surface of the passivation film 50 may be an uneven surface (not shown). Thus, a semiconductor device with higher reliability can be provided. A circuit board 1000 having the semiconductor device 1 mounted thereon is shown in FIG. 4. As an electronic device having a semiconductor device 1, a note type personal computer 2000 is shown in FIG. 5, and a cellular phone 3000 in FIG. 6, respectively.

A method of manufacturing a semiconductor device according to an embodiment of the invention will now be described. FIGS. 7 to 12 are views for illustrating a method of manufacturing a semiconductor device according to the embodiment of the invention.

Figure 7:
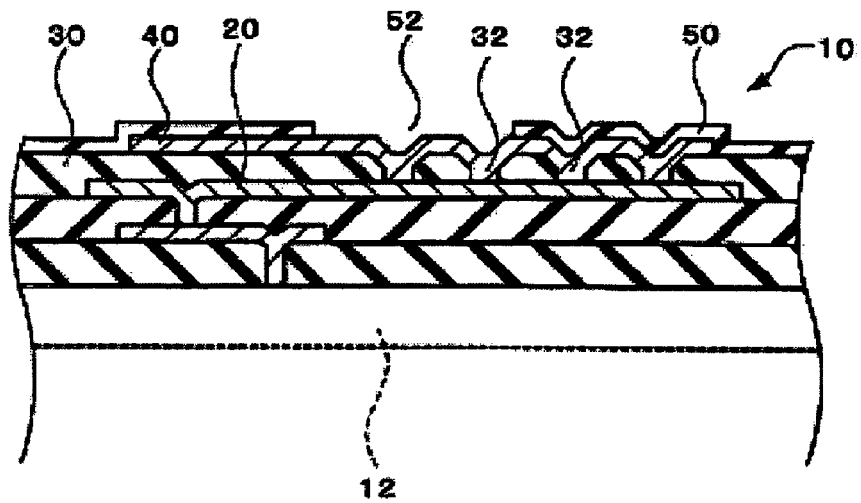
FIGS. 7 to 12 are views for illustrating a method of manufacturing a semiconductor device according to an embodiment of the invention.

The method of manufacturing a semiconductor device according to the embodiment may include preparing the semiconductor substrate 10 shown in FIG. 7. Any one of contents described above may be applied to the structure of the semiconductor substrate 10. The semiconductor substrate 10 contains a plurality of electrode pads 40. The semiconductor substrate 10 also contains the passivation film 50 with the opening 52 that exposes the central area of the electrode pad 40. As shown in FIG. 7, at least part of the end of the opening 52 on the surface of the passivation film 50 is an uneven surface as shown in FIG. 7.

Figure 8:
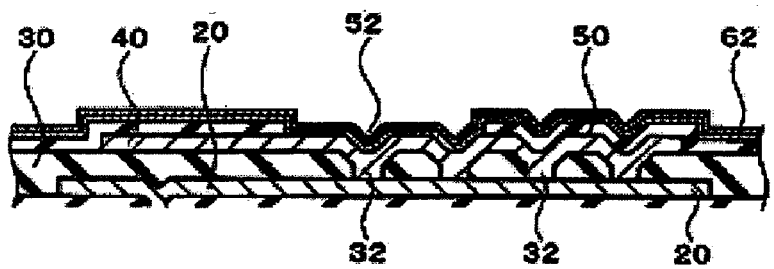

The method of manufacturing a semiconductor device according to the embodiment includes forming a barrier layer 62 on the semiconductor substrate 10 as shown in FIG. 8. The barrier layer 62 may be referred to as an under bump metal layer. The barrier layer 62 may include multiple layers, or may be formed in a single layer. The barrier layer 62 may be formed to cover the passivation film 50. The barrier layer 62 may be formed to contact the portion of the electrode pad 40 that is exposed from the opening 52. The barrier layer 62 attempts to prevent the diffusion of the electrode pad 40 and a conductive material 68, which will be described later. The barrier layer 62 may further have a function to improve the adhesion between the electrode pad 40 and the bump 60. The barrier layer 62 may be a metal layer used for feeding electricity for electrolytic plating that deposits the conductive material 68. The barrier layer 62 may have a titanium—tungsten layer. If the barrier layer 62 includes multiple layers, the uppermost layer of them may be a gold layer.

Figure 11:
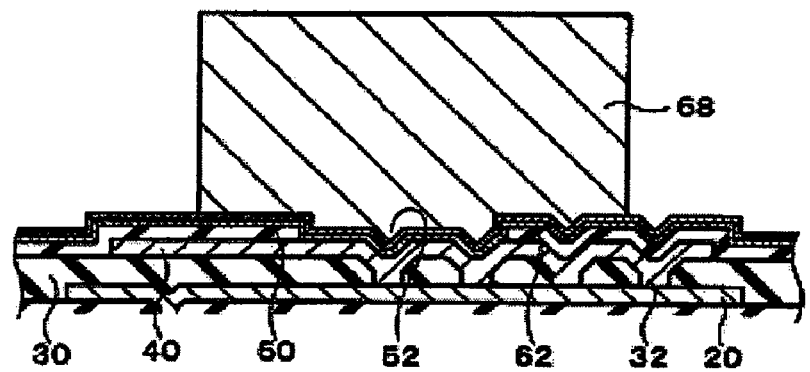

The method of manufacturing a semiconductor device according to the embodiment includes forming the conductive material 68 on the barrier layer 62 (see FIG. 11). The conductive material 68 is formed to overlap the opening 52 of the passivation film 50 and its end. As described before, at least part of the end of the opening 52 on the surface of the passivation film 50 is an uneven surface. Accordingly, the conductive material 68 is formed to overlap the uneven surface on the surface of the passivation film 50. The entire end of the opening 52 on the surface of the passivation film 50 may be an uneven surface. The process of forming the conductive material 68 will be described below.

Figure 9:
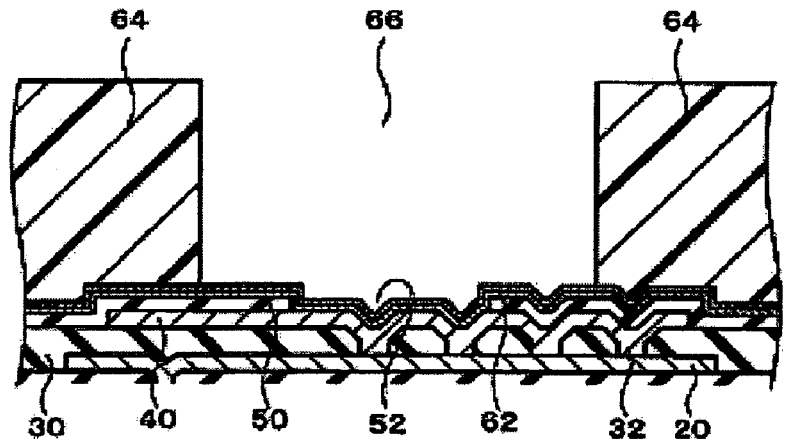
Figure 10:
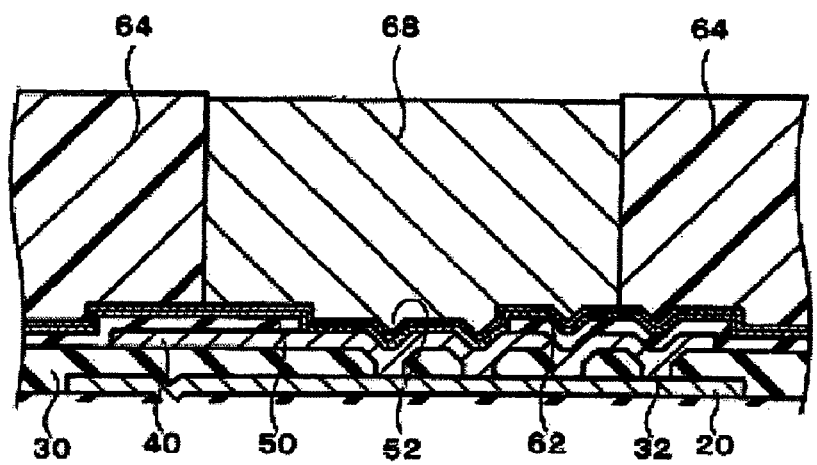

The process of forming the conductive material 68 may include forming a resist layer 64 that has a plurality of second openings 66 on the barrier layer 62 as shown in FIG. 9. Each second opening 66 is disposed to overlap any one of openings 52 of the passivation film 50 and its end. In this case, at least part of an area that overlaps the second opening 66 on the surface of the passivation film 50 is an uneven surface. Namely, the second opening 66 may be disposed to overlap the uneven surface at the end of the opening 52 of the passivation film 50. The entire area overlapping the second opening 66 on the surface of the passivation film 50 may be an uneven surface. A method of forming the resist layer 64 is not particularly limited. For example, the resist layer 64 may be formed by applying a resist layer onto the entire surface of the barrier layer 62 and then forming the second opening 66 in the resist layer. Additionally, the material of the-resist layer 64 is not particularly limited; any one of known materials may be applied. The process of forming the conductive material 68 may include forming the conductive material 68 inside the second opening 66 as shown in FIG. 10. The conductive material 68 may electrically connected to the barrier layer 62. The conductive material 68 may be formed by an electrolytic plating process. The conductive material 68 may be formed to fill the second opening 66. As described before, the second opening 66 is disposed to overlap the opening 52 and its end. Therefore, the conductive material 68 is formed to overlap the opening 52 of the passivation film 50 and its end. If at least part of the area overlapping the second opening 66 on the surface of the passivation film 50 is an uneven surface, the conductive material 68 can be formed to overlap the uneven surface. Additionally, the size and shape of the conductive material 68 are not particularly limited, but can be controlled with the second opening 66. The process of forming the conductive material 68 may include removing the resist layer 64 as shown in FIG. 11. The resist layer 64 may be removed by any one of known methods.

Figure 12:
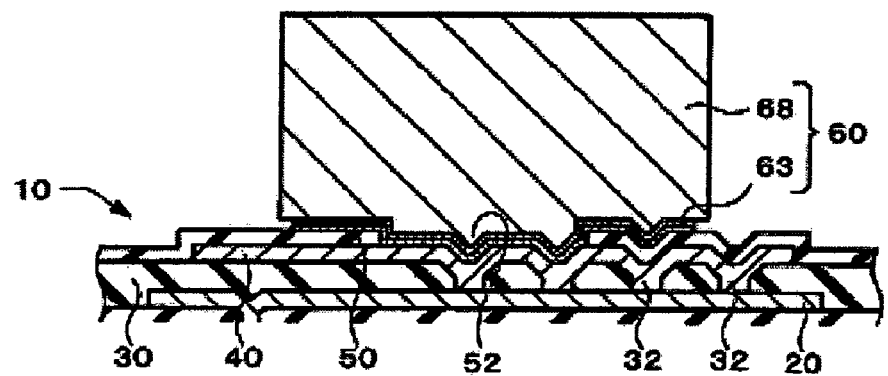

In the method of manufacturing a semiconductor device according to the embodiment, the barrier layer 62 may be partially removed by etching it with the conductive material 68 used as a mask, as shown in FIG. 12. The barrier layer 62 may also be partially removed by wet etching. A conductive layer 63 may be formed by etching the barrier layer 62. At this point, the conductive layer 63 may be formed in an area located more inside than the conductive material 68, as shown in FIG. 12. However, the conductive layer may be formed so as to have the same planar shape as the conductive material 68 or to reach a place located more outside than the conductive material 68 (not shown). A combination of the conductive layer 63 and the conductive material 68 may be referred to as the bump 60.

The semiconductor device 1 may be manufactured by the processes described above (see FIG. 1). As described before, in the method of manufacturing a semiconductor device according to the embodiment, the conductive material 68 is formed to overlap the opening 52 of the passivation film 50 and its end. At least part of the end of the opening 52 on the surface of the passivation film 50 is an uneven surface. Namely, the conductive material 68 is formed to overlap the uneven surface on the surface of the passivation film 50. Consequently, the distance from the end of the conductive material 68 to the opening 52 of the passivation film 50 along the surface of the passivation film 50 is made longer, and therefore the reach of an etchant for etching the barrier layer 62 to the electrode pad 40 can be prevented. As a result, a semiconductor device with high reliability in which corrosion of the electrode pad 40 by an etchant is unlikely to occur can be manufactured. Additionally, the entire end of the opening 52 on the surface of the passivation film 50 may be an uneven surface. Thus, a semiconductor device with higher reliability can be manufactured.

The present invention is not restricted to the embodiment described above, and various modifications thereof can be made. For example, the invention includes substantially the same structure as that described in the embodiment (e.g., a structure with the same function, method, and result, or a structure with the same purpose and effect). The invention includes a structure in which nonessential part of the structure described m the embodiment is replaced. The invention also includes a structure having the same function and effect or a structure attaining the same purpose as in the structure described in the embodiment. The invention further includes a structure in which a known technique is added to the structure described in the embodiment.

What is claimed is:

1. A semiconductor device, comprising:
   a semiconductor substrate containing an electrode pad and a passivation film with an opening that exposes a central area of the electrode pad, the passivation film including a first surface and a second surface opposite the first surface, with at least a part of the first surface facing the electrode pad; and
   a bump electrically connected to the electrode pad, the bump being disposed to directly overlap the opening, an end of the opening and a first area of the second surface;
   wherein at least a part of the first area of the second surface includes a first recess being entirely defined by the passivation film, at least a part of a surface of the electrode pad includes a second recess, and the first recess is formed to directly overlap the second recess.

2. The semiconductor device according to claim 1, wherein:
   the part of the surface of the electrode pad includes a plurality of the second recesses; and
   a second area between two of the plurality of the second recesses adjacent to each other is an even surface.

3. The semiconductor device according to claim 1, wherein at least a part of a third area of the electrode pad exposed from the opening has a third recess.

4. The semiconductor device according to claim 1, wherein:
   the semiconductor substrate further containing a conductive pattern and an insulating layer in which a through-hole partially exposing the conductive pattern is formed;
   the electrode pad is provided to fill the through-hole; and
   the second recess overlaps the through-holes.

5. The semiconductor device according to claim 4, wherein:
   an end of the through-hole at a side opposite to the conductive pattern has a taper shape that widens towards an outside; and
   a periphery of the through-hole on an upper end surface of the insulating layer is an even surface.

6. The semiconductor device according to claim 1, wherein:
   the semiconductor substrate further contains a conductive pattern and an insulating layer in which a through-hole partially exposing the conductive pattern is formed;
   the electrode pad is provided to fill the through-hole; and
   the second recess directly overlaps the through-holes.

* * * * *

UNITED STATES PATENT AND TRADEMARK OFFICE
CERTIFICATE OF CORRECTION

| | | |
|---|---|---|
| PATENT NO. | : 7,598,612 B2 | Page 1 of 1 |
| APPLICATION NO. | : 11/262728 | |
| DATED | : October 6, 2009 | |
| INVENTOR(S) | : Takeshi Yuzawa | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 334 days.

Signed and Sealed this

Twenty-eighth Day of September, 2010

David J. Kappos
*Director of the United States Patent and Trademark Office*